United States Patent
Sakumoto et al.

[11] Patent Number: 5,510,189
[45] Date of Patent: Apr. 23, 1996

[54] ADHESIVE TAPE FOR ELECTRONIC PARTS AND LIQUID ADHESIVE

[75] Inventors: Yukinori Sakumoto; Takeshi Hashimoto; Katsuji Nakaba; Masaharu Kobayashi; Takeshi Nishigaya; Fumiyoshi Yamanashi, all of Shizuoka, Japan

[73] Assignee: Tomoegawa Paper Co., Ltd., Tokyo, Japan

[21] Appl. No.: 462,365

[22] Filed: Jun. 5, 1995

Related U.S. Application Data

[62] Division of Ser. No. 326,427, Oct. 20, 1994.

[30] Foreign Application Priority Data

Oct. 22, 1994 [JP] Japan ................... 5-286204

[51] Int. Cl.$^6$ .................................. B32B 9/04
[52] U.S. Cl. ................ 428/447; 428/343; 428/451
[58] Field of Search ........................ 428/447, 451

[56] References Cited

U.S. PATENT DOCUMENTS

| | | | |
|---|---|---|---|
| 4,145,320 | 3/1979 | Ferruti et al. | 525/382 |
| 5,298,565 | 3/1994 | Lange et al. | 525/382 |
| 5,428,113 | 6/1995 | Sakomoto et al. | 525/329.3 |

*Primary Examiner*—Bernard Lipman
*Attorney, Agent, or Firm*—Lowe, Price, LeBlanc & Becker

[57] ABSTRACT

This invention is to provide a liquid adhesive of the present invention can be adhered and cured at a relatively low temperature and have sufficient heat resistance and reliability, etc., and an adhesive tape using the same.

The liquid adhesive of this invention is obtainable by dissolving (a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

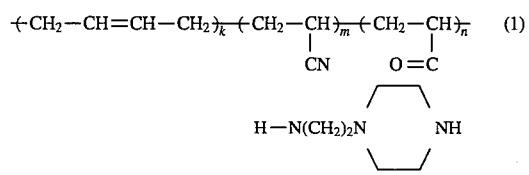

wherein, k, m, and n are molar ratios and taking n as 1, k is a number of 3–175, and m is a number of 0.3 to 93; and (b) a compound having at least two maleimide groups, the ratio of component (b) based on 100 parts by weight of component (a) being in the range of 10 to 900 parts by weight. This is applied to one or both surfaces of a heat resistant film or one surface of a release film to form an adhesive layer, thereby obtaining an adhesive tape for electronic parts.

3 Claims, 2 Drawing Sheets

ADHESIVE TAPE FOR ELECTRONIC PARTS AND LIQUID ADHESIVE

This application is a division application Ser. No. 08/326,427 filed Oct. 20, 1994.

BACKGROUND OF THE INVENTION

1) Field of the Invention

The present invention relates to a adhesive tape and a liquid adhesive for electronic parts to be used for adhering between parts around leadframes making up a semiconductor device, e.g., lead pins, semiconductor chip mounted substrates, radiation plates, semiconductors themselves.

2) Description of the Related Art

Conventionally, adhesive tapes for fixing a leadframe, TAB tapes, etc., are used as adhesive tapes for use in the interior of resin-molded type semiconductor devices. For example, the adhesive tapes for fixing a leadframe have been used to fix lead pins of the leadframe in order to enhance the efficiency for producing the leadframe itself and the whole semiconductor assembly stages. In general, a leadframe manufacturer tapes a leadframe, and brings it to a semiconductor manufacturer, at which a chip is mounted thereon followed by molding the leadframe with a resin. For this reason, it has been required for the adhesive tapes for fixing the leadframe not only to possess general reliability in a level required for semiconductor and enough processability at the time of taping, but also to possess sufficient adhesive strenght immediately after taping and heat resistance enough for withstanding thermal process at the stages of assembling semiconductor devices.

Conventionally, the adhesive tapes for use in such an application include adhesive tapes applying on a support film of a polyimide film, etc., an adhesive comprising a synthetic rubber resin such as polyacrylonitrile, polyacrylate or acrylonitrile-butadiene copolymer solely, or modified with any other resin or blended with any other resin to come into a B-stage.

In recent years, resin-molded type semiconductor devices as shown in FIGS. 1 to 3 have been developed or produced. In FIG. 1, the device has a construction in which lead pins 3 and plane 2 are connected by means of an adhesive layer 6, a semiconductor chip 1 is mounted on the plane 2, and together with bonding wires 4 between the semiconductor chip 1 and the lead pins 3, they are molded with a resin 5. In FIG. 2, the device has a construction in which the lead pins 3 on the leadframe are molded with the semiconductor chip 1 and an adhesive layer 6 and together with a bonding wire 4, they are molded with a resin 5. In FIG. 3, the device has a construction in which a semiconductor chip 1 is mounted on a die pad, electrode 8 is fixed with an adhesive layer 6, the spaces between semiconductor chip 1 and an electrode 8 and between the electrode 8 and lead pins 3 are each connected with bonding wires 4, and they are molded with a resin 5.

In the adhesive layer in the resin-molded type semiconductor devices shown in FIGS. 1 to 3, the use of an adhesive tape to which a conventional adhesive is applied has the problems such as insufficient heat resistance. Also, in the case of the application of polyimide resin, the conditions of temperature and pressure for taping and conditions for curing are severe so that the metal material, such as leadframe, are damaged. Consequently, it has been desired to develop an adhesive for electronic parts which can be coated and cured at a relatively low temperature, and which has sufficient heat resistance and reliability, etc.

SUMMARY OF THE INVENTION

The object of the present invention is, therefore, to provide an adhesive for electronic parts which can be applied and cured at a relatively low temperature, and which has sufficient heat resistance and reliability, etc. and to develop an adhesive tape for electronic parts using the same, The first adhesive tape for electronic parts of the present invention is characterized by laminating at least one surface of a heat resistant film, with an adhesive comprising:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

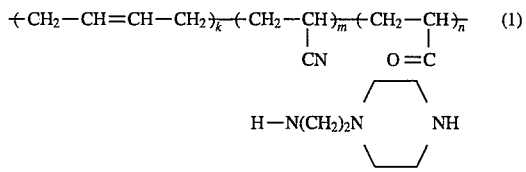

wherein, k, m, and n are molar ratios and taking n as 1, k is a number of 3–175, and m is a number of 0.3 to 93; and (b) a compound having at least two maleimide groups selected from the compounds represented by the following formulae (II-1) to (II-6):

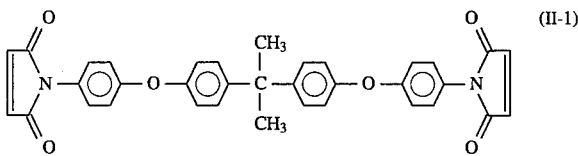

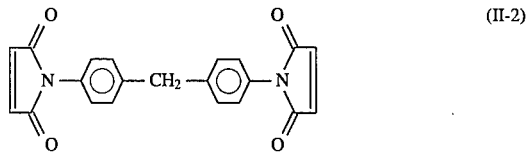

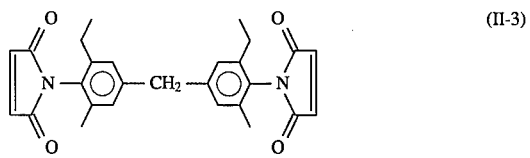

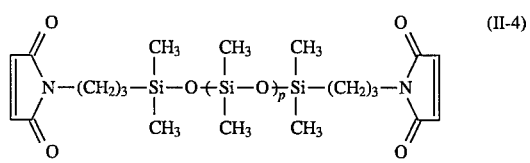

wherein p is an integer of from 0 to 7

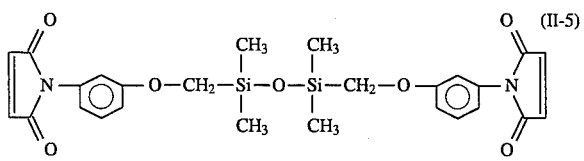

-continued

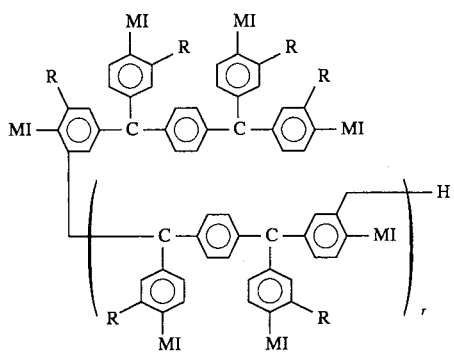
(II-6)

wherein MI=

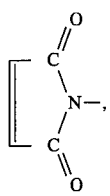

R=H or $CH_3$, and r=1–5
the ratio component (b) based on 100 parts by weight of component (a) being in a range of 10 % to 900 parts by weight.

The second adhesive tape for electronic parts of the present invention is characterized by laminating at least one surface of a heat resistant film with an adhesive comprising: a piperazinylethylaminocarbonyl-containing butadiene-acrylonitrile copolymer of the above-mentioned component (a), a compound having at least two maleimide groups of the above-mentioned component (b), and (c) a diamine compound represented by formula (III):

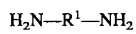 (III)

wherein $R^1$ is a divalent aliphatic, aromatic, or alicyclic group,
or an amino-containing polysiloxane having a weight average molecular weight of 200–7,000 represented by the formula (IV):

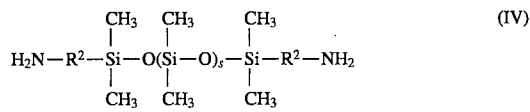 (IV)

wherein $R^2$ is a divalent aliphatic, aromatic, or alicyclic group, and s is an integer of from 0 to 7,
the sum of components (b) and (c) based on 100 parts by weight of component (a) being 10 to 900 parts by weight, and the molar equivalent of the maleimide group in component (b) per mol equivalent of the amino group in component (c) being 1 to 100 mol equivalent.

The third adhesive tape for electronic parts of the present invention is characterized by laminating one surface of a release film with an adhesive comprising: a piperazinylethylaminocarbonyl-containing butadiene-acrylonitrile copolymer of the above-mentioned component (a) and a compound having at least two maleimide groups of the above-mentioned component (b), the ratio of component (b) based on 100 parts by weight of component (a) being in a range of 10 to 900 parts by weight.

The fourth adhesive tape for electronic parts of the present invention is characterized by laminating one surface of a release film with an adhesive comprising: a piperazinylethylaminocarbonyl-containing butadiene-acrylonitrile copolymer of the above-mentioned component (a), a compound having at least two maleimide groups of the above-mentioned component (b), and a diamine Compound or an amino-containing polysiloxane of component (c), the sum of components (b) and (c) based on 100 parts by weight of component (a) being 10 to 900 parts by weight, and the molar equivalent of the maleimide group in component (b) per mol equivalent of the amino group in component (c) being 1 to 100 mol equivalent.

The first liquid adhesive for electronic parts of the present invention is characterized by dissolving a piperazinylethylaminocarbonyl-containing butadiene-acrylonitrile copolymer of the above-mentioned component (a) and a compound having at least two maleimide groups of the above-mentioned component (b) in an organic solvent, the ratio of component (b) based on 100 parts by weight of component (a) being in the range of 10 to 900 parts by weight.

The second liquid adhesive for electronic parts of the present invention is characterized by dissolving a piperazinylethylaminocarbonyl-containing butadiene-acrylonitrile copolymer of the above-mentioned component (a), a compound having at least two maleimide groups of the above-mentioned component (b), and a diamine compound or an amino-containing polysiloxane of component (c), in an organic-solvent, the sum of components (b) and (c) based on 100 parts by weight of component (a) being 10 to 900 parts by weight, and the molar equivalent of the maleimide group in component (b) per mol equivalent of the amino group in component (c) being 1 to 100 mol equivalent.

DETAILED DESCRIPTION OF PREFERRED EMBODIMENTS

Figure 1:
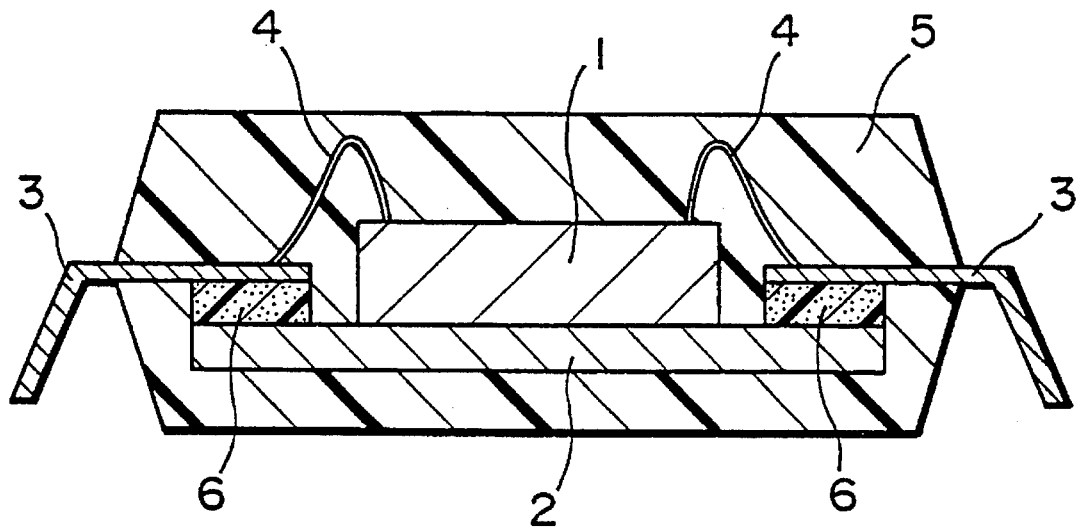
FIG. 1 is a cross-sectional view showing one example of a resin-molded semiconductor device constructed using an adhesive tape of the present invention or a conventional adhesive tape.
Figure 2:
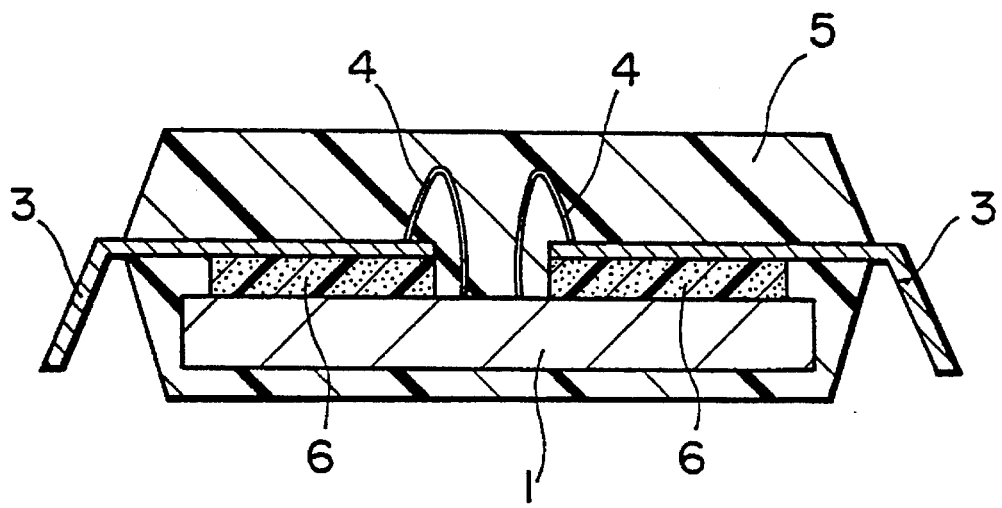
FIG. 2 is a cross-sectional view showing another example of a resin-molded semiconductor device constructed using an adhesive tape of the present invention or a conventional adhesive tape.
Figure 3:
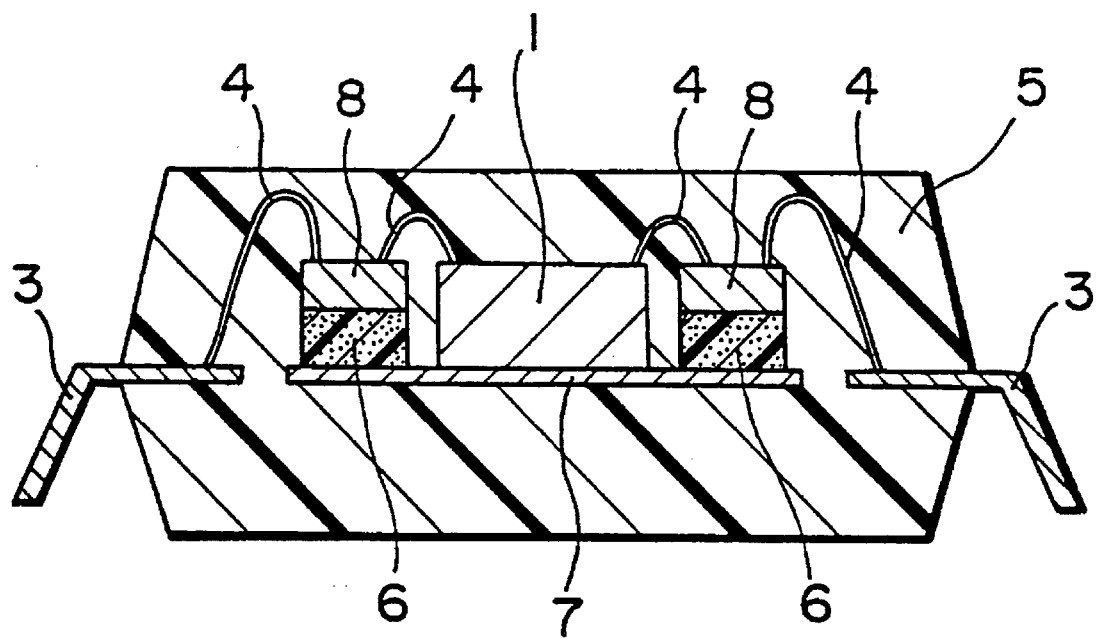
FIG. 3 is a cross-sectional view showing still another example of a resin-molded semiconductor device constructed using an adhesive tape of the present invention or a conventional adhesive tape.

The present invention will now be described in detail. First of all, the first liquid adhesive for use in an adhesive tape for electronic parts will now be described.

The piperazinylethylaminocarbonyl-containing butadiene-acrylonitrile copolymers having a weight average molecular weight of 10,000–200,000, an acrylonitrile content of 5–50% by weight, and an amino equivalent of 500–10,000, represented by the above-mentioned formula (I) to be used as component (a) is a novel substance, which can be synthesized by the condensation of carboxyl-containing butadiene-acrylonitrile copolymers represented by the following formula (V) with N-aminoethylpiperizine in the presence of a phosphite.

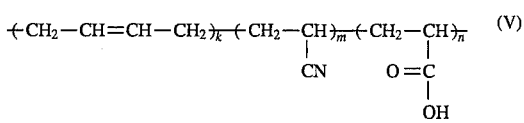

wherein, k, m, and n are molar ratios and taking n as 1, k is a number of 3–175, and m is a number of 0.3 to 93.

The piperazinylethylaminocarbonyl-containing butadiene-acrylonitrile copolymers which can be used in the present invention are those having a weight average molecular weight of 10,000 to 200,000, preferably 20,000 to 150,000, an acrylonitrile content of 5–50% by weight, preferably 10–40% by weight, and an amino equivalent of 500–10,000, preferably 1,000–8,000.

In this case, if the weight average molecular weight is lower than 10,000, the heat stability becomes insufficient leading to a decrease in heat resistance. If it is higher than 200,000, the solubility in the solvent becomes poor, and the melt viscosity is unduly increased, resulting in poor processability when used as an adhesive and in poor adhesive properties. If the acrylonitrile content is less than 5% by weight, the solubility in the solvent becomes low, and, conversely, if it is higher than 50% by weight, the insulating properties become unstable. If the amino equivalent is less than 500, the solubility in the solvent becomes low, while if it exceeds 10,000, the viscosity becomes too low when used as an adhesive by mixing with the maleimide compound, leading to poor processability.

In the first liquid adhesive, the ratio of component (a) to component (b) is set so that the ratio of component (b) based on 100 parts by weight of component (a) is in the range of 10–900 parts by weight, preferably 20–800 parts by weight. If the amount of component (b) is less than 10 parts by weight, the heat resistance of the adhesive after the coating and curing, especially Tg, and Young's modulus, is remarkably degraded, leading to an adhesive unsuitable for the intended purpose. Conversely, if it exceeds 900 parts by weight, the adhesive itself becomes brittle and has inferior processability or has a poor adhesion properties to the heat resistant film as the substrate, when cured into the B-stage.

The mixing of the above-mentioned components (a) and (b) is carried out in a solvent which dissolves both components. Examples of solvents which can be mentioned are N-dimethylformamide, N,N-dimethylacetamide, N-methylpyrrolidone, 1,3-dimethyl-2-imidazoline, dimethylsulfoxide, hexamethylphosphoric amide, hexane, benzene, toluene, xylenes, methanol, ethanol, propanol, isopropanol, diethylether, tetrahydrofuran, methyl acetate, ethyl acetate, acetonitrile, dichloromethane, chloroform, carbon tetrachloride, chlorobenzene, dichlorobenzene, dichloroethane, trichloroethane, etc., and the type and amount of solvent are appropriately selected so that both components (a) and (b) are dissolved therein.

Next, the second liquid adhesive will now be described. The second liquid adhesive is characterized by containing a diamine compound represented by the above general-formula (III) or an amino-containing polysiloxane compound having a weight average molecular weight of 200–7,00 represented by the above formula (IV) as component (c), in addition to components (a) and (b).

In this case, the ratios of component (a) to component (b) to component (c) are set such that the total amount of components (b) plus (c) is 10 to 900 parts by weight, preferably 20 to 800 parts by weight, based on 100 parts by weight of component (a). If the total amount of components (a) plus (b) is less than 10 parts by weight, the heat resistance of the adhesive layer, after coated and cured, especially Tg and the Young's modulus, is markedly decreased, making it unsuitable for an intended use. If it exceeds more than 900 parts by weight, the adhesive itself, when cured into the B stage, becomes brittle leading to poor processability and changing the adhesion properties to the heat resistant film which is the substrate for the worse.

It is necessary for the ratio of component (a) to component (b) to component (c) to be a molar equivalent of maleimide in component (b) in the range of 1 to 100 mol equivalent per mol of the amino group in component (c), and preferably the molar equivalent is set to be in the range of 1 to 80. If the molar equivalent of the meleimide in component (b) is less than 1, gelatinization takes place at the time of mixing so that the adhesive cannot be prepared. If it exceeds 100 mol equivalent, the adhesive itself, when cured into the B stage, becomes brittle leading to poor processability and changing the adhesion properties to the heat resistant film which is the substrate for the worse.

Examples of the diamine compounds represented by the above formula (III), which can be used as component (c) include N,N'-bis(2-aminophenyl)isophthalamide, N,N'-bis(3-aminophenyl)isophthalamide, N,N'-bis(4-aminophenyl)isophthalamide, N,N'-bis(2-aminophenyl)terephthalamide, N,N'-bis(3-aminophenyl)terephthalamide, N,N'-bis(4-aminophenyl)terephthalamide, N,N'-bis(2-aminophenyl)phthalamide, N,N'-bis(3-aminophenyl)phthalamide, N,N'-bis(4-aminophenyl)phthalamide, N,N'-bis(2-aminophenyl)phthalamide, N,N'-bis(4-amino-3,5-dimethylphenyl)terephthalamide, N,N'-bis(4-amino-3,5-dimethylphenyl)terephthalamide, N,N'-bis (4-amino-3,5-dimethylphenyl)phthalamide, N,N'-bis(2-amino-n-butylphenyl)isophthalamide, N,N'-bis(4-amino-n-butylphenyl)isophthalamide, N,N'-bis(4-amino-n-hexylphenyl)isophthalamide, N,N'-bis(4-amino-n-dodecylphenyl)isophthalamide, m-phenylenediamine, p-phenylenediamine, m-tolylenediamine, 4,4'-diaminodiphenyl ether, 3,3'-dimethyl-4,4'-diaminodiphenyl ether, 3,3'-diaminodiphenyl ether, 3,4'-diaminodiphenyl ether, 4,4'-diaminodiphenyl thioether, 3,3'-dimethyl-4,4'-diaminodiphenyl thioether, 3,3'-diethoxy-4,4'-diaminodiphenyl thioether, 3,3'-diaminodiphenyl thioether, 4,4'-diaminobenzophenone, 3,3'-dimethyl-4,4'-diaminobenzophenone, 3,3'-diaminodiphenylmethane, 4,4'-diaminodiphenylmethane, 3,3'-dimethoxy-4,4'-diaminodiphenylmethane, 2,2'-bis(4-aminophenyl)propane, 2,2'-bis(3-aminophenyl)propane, 4,4'-diaminodiphenylsulfoxide, 4,4'-diaminodiphenylsulfone, 3,3'-diaminophenylsulfone, benzidine, 3,3'-dimethylbenzidine, 3,3'-dimethoxybenzidine, 3,3'-diaminobiphenyl, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 2,2-bis[3,5-dimethyl-4-(4-aminophenoxy)phenyl]propane, 1,1-bis[4-(4-aminophenoxy)phenyl]ethane, 1,1-bis[3,3 -chloro-4-(4-aminophenoxy)phenyl]ethane, bis[4-(4-aminophenoxy)phenyl]methane, bis[3-methyl-4-(4-aminophenoxy)phenyl]methane, piperazine, hexamethylenediamine, heptamethylenediamine, tetramethylenediamine, p-xylenediamine, m-xylenediamine, 3-methylheptamethylenediamine, 1,3-bis(4-aminophenoxy)benzene, 2,2-bis(4-aminophenyl)-1,1,1,3,3,3-hexafluoropropane, 2,2-bis[4(4-aminophenoxy)phenyl]-1,1,1,3,3,3-hexafluoropropane, 4,4'[1,4-phenylene-bis(1-methylethylidene)]-bisaniline, 4,4'-[1,3-phenylene-bis(1-methylethylidene)]-bisaniline, 4,4'-[1,4-phenylene-bis(1-methylethylidene)]-bis(2,6-dimethylbisaniline), etc.

Examples of the amino-containing polysiloxane compound having a weight average molecular weight of 200–7, 000 represented by the above formula (IV) include 1,3-bis(3 -aminopropyl)-1,1,3,3-tetramethyldisiloxane, α, ω-bis(3-aminopropyl)polydimethylsiloxane, 1,3-bis(3 -aminophenoxymethyl)-1,1,3,3-tetramethyldisiloxane, α, ω-bis-(3 -aminophenoxy)polydimethylsiloxane, 1,3-bis[2-(3-aminophenoxymethyl)ethyl]- 1,1,3,3-tetramethyldisiloxane, α, ω-bis[2-(3-aminophenoxy)ethyl]polydimethylsiloxane, 1,3-bis[3-(3-aminophenoxy)propyl]-1,1,3,3-tetramethyldisiloxane, α, ω-bis[3-(3-aminophenoxy)propyl]polydimethylsiloxane, etc.

The mixing of components (a), (b), and (c) are carried out in a solvent which dissolves these components. The solvents which can be used are those exemplified in the first liquid adhesive.

In order to accelerate the addition reaction between components (a) and (b) and the addition reaction between two or more of components (b), to the first and second liquid adhesives of the present invention may optionally be added diazabicyclooctane or organic peroxides such as methyl ethyl ketone peroxide, cyclohexane peroxide, 3,3,5-trimethylcyclohexanone peroxide, methylcyclohexanone peroxide, methylacetoacetate peroxide, acetylacetone peroxide, 1,1-bis(t-butylperoxy)-3,3,5-trimethylcyclohexane, 1,1-bis(t-butylperoxy)cyclohexane, 2,2-bis(t-butylperoxy)octane, n-butyl-4,4-bis(t-butylperoxy)valerate, 2,2-bis(t-butylperoxy)butane, t-butyl hydroperoxide, cumene hydroperoxide, di-isopropylbenzene hydroperoxide, p-mentane hydroperoxide, 2,5-dimethylhexane-2,5-dihydroperoxide, 1,1,3,3-tetramethylbutyl hydroperoxide, di-t-butyl peroxide, t-butylcumyl peroxide, dicumyl peroxide, α, α'-bis(t-butylperoxy-m-isopropyl)benzene, 2,5-dimethyl-2,5-di-(t-butylperoxy)hexane, 2,5-dimethyl-2,5-di(t-butylperoxy)hexyne, acetyl peroxide, isobutyl peroxide, octanoyl peroxide, decanoyl peroxide, benzoyl peroxide, lauroyl peroxide, 3,5,5-trimethylhexanoyl peroxide, succinic acid peroxide, 2,4-dichlorobenzoyl peroxide, m-toluoyl peroxide, di-isopropylperoxy dicarbonate, di-2-ethylhexylperoxy dicarbonate, di-n-propylperoxy dicarbonate, bis-(4-t-butylcyclohexyl)peroxy dicarbonate, di-myristylperoxy dicarbonate, di-2-ethoxyethylperoxy dicarbonate, dimethoxyisopropylperoxy dicarbonate, di(3 -methyl-3-methoxybutyl)peroxy dicarbonate, di-allylperoxy dicarbonate, t-butylperoxy acetate, t-butylperoxy isobutyrate, t-butylperoxy pivalate, t-butylperoxy neodecanate, cumylperoxy neododecanate, t-butylperoxy 2-ethylhexanate, t-butylperoxy-3,5,5-trimethylhexanate, t-butylperoxy laurate, t-butylperoxy dibenzoate, di-t-butylperoxy isophthalate, 2,5-dimethyl-2,5-di(benzoylperoxy)hexane, t-butylperoxy maleic acid, t-butylperoxy isopropylcarbonate, cumylperoxy octate, t-hexylperoxy neodecanate, t-hexylperoxy pivalate, t-butylperoxy neohexanate, t-hexylperoxy neohexanate, cumylperoxy neohexanate, acetylcyclohexylsulfonyl peroxide, and t-butylperoxy allylcarbonate; and imidazoles such as 1,2-dimethylimidazole, 1-methyl-2-ethylimidazole, 2-methylimidazole, 2-ethyl-4-methylimidazole, 2-undecylimidazole, 2-heptadecylimidazole, 2-phenylimidazole, 1-benzyl-2-methylimidazole, 1-benzyl-2-phenylimidazole, 1 -benzyl-2-phenylimidazole trimellitate, 1-benzyl-2-ethylimidazole, 1-benzyl-2-ethyl-5-methylimidazole, ethylimidazole, 2-isopropylimidazole, 2-phenyl-4-benzylimidazole, 1-cyanoethyl-2-methylimidazole, 1 -cyanoethyl-2-ethyl-4-methylimidazole, 1-cyanoethyl-2-undecylimidazole, 1-cyanoethyl-2-isopropylimidazole, 1 -cyanoethyl-2-phenylimidazole, 1-cyanoethyl-2-methylimidazolium trimellitate, 1-cyanoethyl-2-ethyl-4-methylimidazolium trimellitate, 1-cyanoethyl-2-phenylimidazolium trimellitate, 2,4-diamino-6-[2' -methylimidazolyl-(1)]-ethyl-S-triazine, 2,4-diamino-6-[2' -ethyl-4-methylimidazolyl-(1)]-ethyl-S-triazine, 2,4-diamino-6 -[2'-undecylimidazolyl-(1)]-ethyl-S-triazine, isocyanuric acid adduct of 2-methylimidazolium, isocyanuric acid adduct of 2-phenylimidazolium, isocyanuric acid adduct of 2,4 -diamino-6-[2'-methylimidazole-(1)]-ethyl-S-triazine, 2 -phenyl-4,5-dihydroxymethylimidazole, 2-phenyl-4-methyl-5-hydroxymethylimidazole, 2-phenyl-4-benzyl-5-hydroxymethylimidazole, 4,4'-methylene-bis-(2-ethyl-5-methylimidazole), 1-aminoethyl-2-methylimidazole, 1 -cyanoethyl-2-phenyl-4,5-di(cyanoethyoxymethyl)imidazole, 1 -dodecyl-2-methyl-3-benzylimidazolium chloride, 4,4' -methylene-bis-(2-ethyl-5-methylimidazole), 2 -methylimidazole-benzotriazole adduct, 1,2-dimethylimidazole-brenzotriazole adduct, 1-aminoethyl-2-ethylimidazole, 1 -(cyanoethylaminoethyl)-2-methylimidazole, N,N'-[-2-methylimidazolyl-(1)-ethyl]-adipoyldiamide, N,N'-bis-(2 -methylimidazolyl-1-ethyl)urea, N-[2-methylimidazolyl-1-ethyl]-urea, N,N'-[2-methylimidazolyl-(1)ethyl]dodecanedioyldiamide, N,N'-[2-methylimidazolyl-(1)ethyl]eicosanedioyldiamide, 1-benzyl-2-phenylimidazole hydrochloride, and 1-cyanoethyl-2-phenyl-4,5-di(cyanoethoxylmethyl)imidazole; and reaction accelerators such as triphenyl phosphine.

Into the first and second liquid adhesives of the present invention may be incorporated a filler having a particle size of about 1 μm in order to stabilize the taping characteristics of the adhesives. The filler content is set to be 4–40% by weight, preferably 9–24% by weight of the total solid content. If the content is less than 4% by weight, the effect for stabilizing the taping characteristics on taping becomes low. If it exceeds 40% by weight, the adhesion strength of the adhesive tape becomes low and the processability such as for lamination becomes poor.

Examples of fillers which can be used include silica, quartz powder, alumina, calcium carbonate, magnesium oxide, diamond powder, mica, fluorinated resin powder, zircon powder, etc.

The first and second liquid adhesives of the present invention may optionally be isolated after the reaction has been ended, and thereafter washed with an organic solvent, water or a mixture of an organic solvent with water, and again dissolved in the above organic solvent.

Examples of organic solvents which can be used in washing include acetone, methyl ethyl ketone, hexane, benzene, toluene, xylenes, methanol, ethanol, propanol, diethyl ether, tetrahydrofuran, methyl acetate, ethyl acetate, acetonitrile, dichloromethane, chloroform, carbon tetrachloride, chlorobenzene, dichlorobenzene, dichloroethane, trichloroethane, etc.

The adhesive tape for electronic parts using the above liquid adhesive will be described.

In the production of the adhesive tape of the present invention, the first or second liquid adhesive for electronic parts described above may be applied onto either or both side(s) of a heat resistant film or onto one side of a release film, followed by drying. In this case, the adhesive may be applied so as to be a thickness of 5 to 100 μm, preferably 10 to 50 μm.

As the heat resistant film, a film of a heat resistant resin such as polyimide, polyphenylene sulfide, polyether, polyparabenic acid, or in some cases polyethylene terephthalate, or a composite heat resistant substrate such as epoxy resin-glass cloth, or epoxy resin-polyimide-glass cloth is used, with the use of a polyimide film being preferable.

The thickness of the heat resistant film is preferably set to be 7.5 to 130 μm, more preferably 12.5 to 75 μm. If the thickness is too thin, the film becomes too soft to handle. If it is too thick, the punch dying is difficult. Accordingly, the above range is preferable.

The release film used has a thickness of 1 to 200 μm, preferably 10 to 100 μm, and can be used as a temporary substrate. Examples of available release films are polypropylene films, fluorine resin films, polyethylene films, polyethylene terephthalete films, paper and in some cases the above films to which release properties are imparted by silicone resin.

These films preferably have a 90° peel release strength in the range of 0.01 to 7.0 g. If the release strength is lower than the above range, there is the problem of the release film being unwillingly released when feeded it. If it is higher than the above range, the release film cannot be smoothly released from the adhesive layer, leading to the problem in terms of processability.

In the case where the above liquid adhesive is applied onto either or both side(s) of the heat resistant film, a protective film having release properties may be placed on the adhesive layer(s). As the protective film having release properties, a film similar to the above-mentioned release films can be used.

The liquid adhesive of the present invention having the above construction can be adhered and cured at a relatively low temperature, and has sufficient heat resistance and reliability. The adhesive tape for electronic parts using the same can suitably be used as an adhesive tape for the innerlead lock of a leadframe and a TAB tape, e.g., for adhering between parts constituting a semiconductor device, for example, lead pins, semiconductor-mounted substrates, heat spreaders, semiconductor chips themselves.

EXAMPLES (Production of Liquid Adhesive)

Example 1

70 parts by weight of a piperazinylethylaminocarbonyl-containing butadiene-acrylonitrile copolymer having a weight average molecular weight of 7,0000, an acrylonitrile content of 25% by weight, and an amino equivalent of 4,000 (k=55, m=1.8, n=1), 30 parts by weight of a compound represented by the above mentioned formula (II-1), and 1 part of benzoyl peroxide were added to, mixed with and well dissolved in tetrahydrofuran to obtain a liquid adhesive having a solid content of 40% by weight.

Example 2

A liquid adhesive was obtained in the same manner as in Example 1, except that the amount of the piperazinylethylaminocarbonyl-containing butadiene-acrylonitrile copolymer was changed from 70 parts by weight to 50 parts by weight, and the amount of the compound represented by formula (II-1) was changed from 30 parts by weight to 50 parts by weight.

Example 3

A liquid adhesive was obtained in the same manner as in Example 1, except that the amount of the piperazinylethylaminocarbonyl-containing butadieneacrylonitrile copolymer was changed from 70 parts by weight to 30 parts by weight, and the amount of the compound represented by formula (II-1) was changed from 30 parts by weight to 70 parts by weight.

Example 4

A liquid adhesive was obtained in the same manner as in Example 1, except that the amount of the piperazinylethylaminocarbonyl-containing butadiene-acrylonitrile copolymer was changed from 70 parts by weight to 10 parts by weight, and the amount of the compound represented by formula (II-1) was changed from 30 parts by weight to 90 parts by weight.

Example 5

A liquid adhesive was obtained in the same manner as in Example 1, except that the compound represented by formula (II-2) was used instead of the compound represented by formula (II-1).

Example 6

A liquid adhesive was obtained in the same manner as in Example 1, except that the compound represented by formula (II-3) was used instead of the compound represented by formula (II-1).

Example 7

A liquid adhesive was obtained in the same manner as in Example 1, except that the compound represented by the following formula was used instead of the compound represented by formula (II-1).

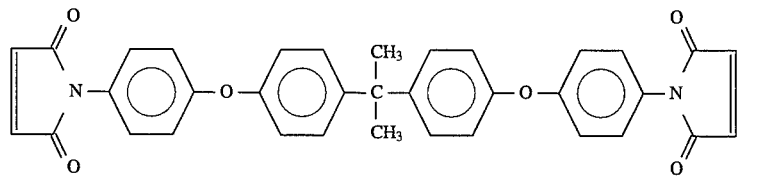

Example 8

A liquid adhesive was obtained in the same manner as in Example 1, except that a type of the compound represented by formula (II-6) (MP 2000X, produced by MITUBISHI PETROLEUM CHEMICAL COMPANY LTD.) was used instead of the compound represented by formula (II-1).

Example 9

30 parts by weight of a piperazinylethylaminocarbonyl-containing butadiene-acrylonitrile copolymer having a weight average molecular weight of 70,000, an acrylonitrile content of 25% by weight, and an amino equivalent of 4,000 (k=55, m=18, n=1), 61 parts by weight of a compound represented by the above mentioned formula (II-1), 9 parts by weight of 1,3-bis(3-aminopropyl)-1,1,3,3-tetramethyldisiloxane (molar equivalent of the maleimide group per molar equivalent of the amino group in the above compound: 1.46), and 1 part of benzoyl peroxide were added to, mixed with, and well dissolved in tetrahydrofuran to obtain a liquid adhesive having a solid content of 40% by weight.

Example 10

A liquid adhesive was obtained in the same manner as in Example 9, except that the amount of the compound represented by formula (II-1) was changed from 61 parts by weight to 63 parts by weight, and 7 parts by weight of 1,3-bis(3-aminopropyl)-1,1,3,3-tetramethyldisiloxane (molar equivalent of the maleimide group per molar equivalent of the amino group in the above compound: 1.97) was used instead of 9 parts by weight of the 1,3-bis(3-aminopropyl)-1,1,3,3-tetramethyldisiloxane.

Example 11

A liquid adhesive was obtained in the same manner as in Example 9, except that the amount of the compound represented by formula (II-1) was changed from 61 parts by weight to 66 parts by weight, and 4 parts by weight of 1,3-bis-(3-aminopropyl)-1,1,3,3-tetramethyldisiloxane (molar equivalent of the maleimide group per molar equivalent of the amino group in the above compound: 3.60) was used instead of 9 parts by weight of the 1,3-bis(3-aminopropyl)-1,1,3,3-tetramethyldisiloxane.

Example 12

A liquid adhesive was obtained in the same manner as in Example 9, except that the amount of the compound represented by formula (II-1) was changed from 61 parts by weight to 68 parts by weight, and 2 parts by weight of 1,3-bis-(3-aminopropyl)-1,1,3,3-tetramethyldisiloxane (molar equivalent of the maleimide group per molar equivalent of the amino group in the above compound: 7.50) was used instead of 9 parts by weight of the 1,3-bis-(3-aminopropyl)-1,1,3,3-tetramethyldisiloxane.

Example 13

A liquid adhesive was obtained in the same manner as in Example 9, except that amount of the piperazinylethylaminocarbonyl-containing butadiene-acrylonitrile copolymer was changed from 30 parts by weight to 70 parts by weight, the amount of the compound represented by formula (II-1) was changed from 61 parts by weight to 28 parts by weight, and 2 parts by weight of 1,3-bis(3-aminopropyl)-1,1,3,3-tetramethyldisiloxane (molar equivalent of the maleimide group per molar equivalent of the amino group in the above compound: 3.06) was used instead of 9 parts by weight of the 1,3-bis(3-aminopropyl)-1,1,3,3-tetramethyldisiloxane

Example 14

A liquid adhesive was obtained in the same manner as in Example 9, except that amount of the piperazinylethylaminocarbonyl-containing butadiene-acrylonitrile copolymer was changed from 30 parts by weight to 50 parts by weight, the amount of the compound represented by formula (II-1) was changed from 61 parts by weight to 47 parts by weight, and 3 parts by weight of 1,3-bis(3-aminopropyl)-1,1,3,3-tetramethyldisiloxane (molar equivalent of the maleimide group per molar equivalent of the amino group in the above compound: 3.44) was used instead of 9 parts by weight of the 1,3-bis(3-aminopropyl)-1,1,3,3-tetramethyldisiloxane.

Example 15

A liquid adhesive was obtained in the same manner as in Example 9, except that amount of the piperazinylethylaminocarbonyl-containing butadiene-acrylonitrile copolymer was changed from 30 parts by weight to 10 parts by weight, the amount of the compound represented by formula (II-1) was changed from 61 parts by weight to 85 parts by weight, and 5 parts by weight of 1,3-bis(3-aminopropyl)-1,1,3,3-tetramethyldisiloxane (molar equivalent of the maleimide group per molar equivalent of the amino group in the above compound: 3.75) was used instead of 9 parts by weight of the 1,3-bis(3-aminopropyl)-1,1,3,3-tetramethyldisiloxane.

Example 16

A liquid adhesive was obtained in the same manner as in Example 9, except that the amount of the compound represented by the formula (II-1) was changed from 61 parts by weight to 62 parts by weight and 8 parts by weight of α,ω-bis(3-aminopropyl)polydimethylsiloxane (polymerization degree: 4) (molar equivalent of the maleimide group per molar equivalent of the amino group in the above compound: 3.66) were used instead of 9 parts by weight of the 1,3-bis(3-aminopropyl)-1,1,3,3-tetramethyldisiloxane.

Example 17

A liquid adhesive was obtained in the same manner as in Example 9, except that the amount of the compound represented by the formula (II-1) was changed from 61 parts by weight to 58 parts by weight and 12 parts by weight of α,ω-bis(3-aminopropyl)polydimethylsiloxane (polymerization degree: 8) (molar equivalent of the maleimide group per molar equivalent of the amino group in the above compound: 3.34) was used instead of 9 parts by weight of the 1,3-bis(3-aminopropyl)-1,1,3,3-tetramethyldisiloxane.

Example 18

A liquid adhesive was obtained in the same manner as in Example 9, except that the amount of the compound represented by formula (II-1) was changed from 61 parts by weight to 64 parts by weight, and 6 parts by weight of 1,3-bis(3-aminophenoxymethyl)-1,1,3,3-tetramethyldisiloxane (molar equivalent of the maleimide group per molar equivalent of the amino group in the above compound: 3.66) were used instead of 9 parts by weight of the 1,3-bis(3-aminopropyl)-1,1,3,3-tetramethyldisiloxane.

Example 19

A liquid adhesive was obtained in the same manner as in Example 9, except that the amount of the compound represented by formula (II-1) was changed from 61 parts by weight to 69 parts by weight, and 1 part by weight ethylenediamine (molar equivalent of the maleimide group per molar equivalent of the amino group in the above compound: 4.00) was used instead of 9 parts by weight of the 1,3-bis(3-aminopropyl)-1,1,3,3-tetramethyldisiloxane.

Example 20

A liquid adhesive was obtained in the same manner as in Example 9, except that the amount of the compound represented by formula (II-1) was changed from 61 parts by weight to 68 parts by weight, and 2 parts by weight of hexamethylenediamine (molar equivalent of the maleimide group per molar equivalent of the amino group in the above compound: 3.00) was used instead of 9 parts by weight of the 1,3-bis(3-aminopropyl)-1,1,3,3-tetramethyldisiloxane.

Example 21

A liquid adhesive was obtained in the same manner as in Example 9, except that the amount of the compound represented by formula (II-1) was changed from 61 parts by weight to 67 parts by weight, and 3 parts by weight of 1,8-diaminooctane (molar equivalent of the maleimide group per molar equivalent of the amino group in the above compound: 4.00) was used instead of 9 parts by weight of the 1,3-bis(3-aminopropyl) -1,1,3,3-tetramethyldisiloxane.

Example 22

A liquid adhesive was obtained in the same manner as in Example 9, except that the amount of the compound represented by formula (II-1) was changed from 61 parts by weight to 66 parts by weight, and 4 parts by weight of 3,4-diaminodiphenyl ether (molar equivalent of the maleimide group per molar equivalent of the amino group in the above compound: 2.88) was used instead of 9 parts by weight of the 1,3-bis(3-aminopropyl) -1,1,3,3-tetramethyldisiloxane.

Example 23

A liquid adhesive was obtained in the same manner as in Example 9, except that the amount of the compound represented by formula (II-1) was changed from 61 parts by weight to 63 parts by weight, and 7 parts by weight of 2,2-bis(4 -(4-aminopenoxy)phenyl]propane (molar equivalent of the maleimide group per molar equivalent of the amino group in the above compound: 3.65) was used instead of 9 parts by weight of the 1,3-bis(3-aminopropyl)-1,1,3,3-tetramethyldisiloxane.

Example 24

A liquid adhesive was obtained in the same manner as in Example 9, except that the compound represented by formula (II-2) was used instead of the compound represented by formula (II-1). The molar equivalent of the maleimide group in the compound represented by formula (II-2) per molar equivalent of the amino group in the tetramethyldisiloxane compound was 2.33.

Example 25

A liquid adhesive was obtained in the same manner as in Example 9, except that the compound represented by formula (II-3) was used instead of the compound represented by formula (II-1). The molar equivalent of the maleimide group in the compound represented by formula (II-3) per molar equivalent of the amino group in the tetramethyldisiloxane compound was 1.93.

Example 26

A liquid adhesive was obtained in the same manner as in Example 9, except that the compound represented by formula (II-5) was used instead of the compound represented by formula (II-1). The molar equivalent of the maleimide group in the compound represented by formula (II-5) per molar equivalent of the amino group in the tetramethyldisiloxane compound was 8.35.

Example 27

A liquid adhesive was obtained in the same manner as in Example 9, except that the compound represented by formula (II-6) was used instead of the compound represented by formula (II-1). The molar equivalent of the maleimide group in the compound represented by formula (II-6) per molar equivalent of the amino group in the tetramethyldisiloxane compound was 8.35.

Example 28

A liquid adhesive was obtained in the same manner as in Example 9, except that a piperazinylethylaminocarbonyl-containing butadiene-acrylonitrile copolymer having a weight average molecular weight of 20,000, an acrylonitrile content of 20% by weight, and an amino equivalent of 4,000 ($k=58.4$, $m=14.6$, $n=1$) was used instead of the piperazinylethylaminocarbonyl-containing butadiene-acrylonitrile copolymer in Example 9.

Example 29

A liquid adhesive was obtained in the same manner as in Example 9, except that a piperazinylethylaminocarbonyl-containing butadiene-acrylonitrile copolymer having a weight average molecular weight of 20,000, an acrylonitrile content of 30% by weight, and an amino equivalent of 4,000 ($k=51$, $m=22$, $n=1$) was used instead of the piperazinylethylaminocarbonyl-containing butadiene-acrylonitrile copolymer in Example 9.

Example 30

A liquid adhesive was obtained in the same manner as in Example 9, except that a piperazinylethylaminocarbonyl-containing butadiene-acrylonitrile copolymer having a weight average molecular weight of 70,000, an acrylonitrile content of 20% by weight, and an amino equivalent of 2,000 ($k=27$, $m=7$, $n=1$) was used instead of the piperazinylethylaminocarbonyl-containing butadiene-acrylonitrile copolymer in Example 9.

Example 31

A liquid adhesive was obtained in the same manner as in Example 9, except that a piperazinylethylaminocarbonyl-containing butadiene-acrylonitrile copolymer having a weight average molecular weight of 70,000, an acrylonitrile content of 20% by weight, and an amino equivalent of 4,000 ($k=58.4$, $m=14.6$, $n=1$) was used instead of the piperazinylethylaminocarbonyl-containing butadiene-acrylonitrile copolymer in Example 9.

Example 32

A liquid adhesive was obtained in the same manner as in Example 9, except that a piperazinylethylaminocarbonyl-containing butadiene-acrylonitrile copolymer having a weight average molecular weight of 70,000, an acrylonitrile content of 20% by weight, and an amino equivalent of 8,000 ($k=118$, $m=29$, $n=1$) was used instead of the piperazinylethylaminocarbonyl-containing butadiene-acrylonitrile copolymer in Example 9.

Example 33

A liquid adhesive was obtained in the same manner as in Example 9, except that a piperazinylethylaminocarbonyl-containing butadiene-acrylonitrile copolymer having a weight average molecular weight of 70,000, an acrylonitrile content of 25% by weight, and an amino equivalent of 2,000 (k=25.5, m=8.5, n=1) was used instead of the piperazinylethylaminocarbonyl-containing butadiene-acrylonitrile copolymer in Example 9.

Example 34

A liquid adhesive was obtained in the same manner as in Example 9, except that a piperazinylethylaminocarbonyl-containing butadiene-acrylonitrile copolymer having a weight average molecular weight of 70,000, an acrylonitrile content of 25% by weight, and an amino equivalent of 8,000 (k=110, m=37, n=1) was used instead of the piperazinylethylaminocarbonyl-containing butadiene-acrylonitrile copolymer in Example 9.

Example 35

A liquid adhesive was obtained in the same manner as in Example 9, except that a piperazinylethylaminocarbonyl-containing butadiene-acrylonitrile copolymer having a weight average molecular weight of 70,000, an acrylonitrile content of 30% by weight, and an amino equivalent of 4,000 (k=51, m=22, n=n=1) was used instead of the piperazinylethylaminocarbonyl-containing butadiene-acrylonitrile copolymer in Example 9.

Example 36

A liquid adhesive was obtained in the same manner as in Example 9, except that a piperazinylethylaminocarbonyl-containing butadiene-acrylonitrile copolymer having a weight average molecular weight of 150,000, an acrylonitrile content of 20% by weight, and an amino equivalent of 4,000 (k=58.4, m=14.6, n=1) was used instead of the piperazinylethylaminocarbonyl-containing butadiene-acrylonitrile copolymer in Example 9.

Example 37

A liquid adhesive was obtained in the same manner as in Example 9, except that a piperazinylethylaminocarbonyl-containing butadiene-acrylonitrile copolymer having a weight average molecular weight of 150,000, an acrylonitrile content of 30% by weight, and an amino equivalent of 4,000 (k=51, m=22, n=1) was used instead of the piperazinylethylaminocarbonyl-containing butadiene-acrylonitrile copolymer in Example 9.

Example 38

A liquid adhesive was obtained by dispersing in and mixing with 10 parts by weight of an alumina filler (produced by SHOWA DENKO K.K.) 100 parts by weight of the liquid adhesive obtained in Example 1.

Example 39

A liquid adhesive was obtained by dispersing in and mixing with 10 parts by weight of an alumina filler (produced by SHOWA DENKO K.K.) 100 parts by weight of the liquid adhesive obtained in Example 9.

Comparative Example 1

A-nylon-epoxy adhesive (TORESINE FS-410, produced by Teikoku Kagaku Sangyo K.K.) (solid content: 20%; solvent isopropyl alcohol:methyl ethyl ketone=2:1) was prepared.

Comparative Example 2

A 20% by weight strength solution of polyimide varnish (Lark TPI, produced by MITUI TOATSU CHEMICALS INC.) in N-methylpyrolidone was prepared.
(Production of Adhesive Tape)

Each of the adhesives obtained from Examples 1 to 39 was applied onto both surfaces of a polyimide film so as to become 20 μm thick, and dried in a hot air circulating oven at 150° C. for 5 minutes to produce an adhesive tape.

Production of Comparative Tape 1

The adhesive obtained from Comparative Example 1 was applied onto both surfaces of a polyimide film so as to become 20 μm thick, and dried in a hot air circulating oven at 120° C. for 15 minutes to produce an adhesive tape.

Production of Comparative Tape 2

The adhesive obtained from Comparative Example 2 was applied onto both surfaces of a polyimide film so as to become 20 μm thick, and dried in a hot air circulating oven at 150° C. for 120 minutes, and then 250° C. for 60 minutes to produce an adhesive tape.
(Assembling of Leadframe)

The leadframe used in a semiconductor package as shown in FIG. 1 was assembled according to the following procedures.
(a) Punch Die of Adhesive Tape The adhesive tape was subjected to punch dying by mold.
(b) Pre-attachment of Adhesive Tape A metal plane was placed on a hot plate, and the tape punched out in a ring form was pressed onto the plane by means of a metal rod to be pre-attached.
(c) Assembling of Leadframe The metal plane to which the adhesive tape had been pre-attached in the above stage and a leadframe, which has no die pad, were positioned, and heated and pressed on a hot plate heated at 120° C. to adhere the leadframe and the plane via the adhesive tape.
(d) Curing of Adhesive Tape In a hot air circulating oven whose atmosphere was substituted by nitrogen, the adhesive tape was cured on the leadframe assembled in the above three stages under the conditions described in Table 1.

TABLE 1

| Adhesive tape | Name of Operation | | |
|---|---|---|---|
| | Pre-attachment of Adhesive Tape | Assembling of Leadframe | Curing of Adhesive Tape |
| Adhesive Tapes from Examples 1–39 | 100° C./2 sec./ 4 kg/cm$^2$ | 120° C./2 sec./ 4 kg/cm 2 | 250° C./ 90 sec. |
| Adhesive Tape from Comparative Example 1 | 80° C./2 sec./ 4 kg/cm$^2$ | 120° C./2 sec./ 4 kg/cm 2 | 150° C./3 hrs. |
| Adhesive Tape from Comparative Example 2 | 350° C./10 sec./ 4 kg/cm$^2$ | 350° C./15 sec./ 20 kg/cm$^2$ | None |

(Assembling of Semiconductor Package)

Thereafter, the produced leadframe was used to assemble a package according to the following procedures. The reason why the conditions of curing were different at the time of assembling the package is that the characteristics of the adhesives are different from each other. Here, optimum conditions for each adhesive were selected, and the adhesive was cured based on such conditions.

(a) Die Bonding

A semiconductor chip was adhered to a plane portion with a silver paste for die bonding, which was then cured at 150° C. for 2 hours.

(b) Wire Bonding

Using a wire bonder, a wire pad on the semiconductor chip and a silver plated portion at the end of the inner lead were connected with a gold wire.

(c) Molding

Using an epoxy molding compound, transfer molding was carried out.

(d) Finishing Stage

Via stages of forming, dum cutting, solder plating on the outer leads, etc., the packaging was finished.

(The Results of Evaluations of Adhesive Tapes and Semiconductor Packages)

(a) Temperature range of Taping

The evaluation of whether or not the adhesive tape could be easily and rapidly adhered to the substance to be adhered, i.e., the plane or lead pins was carried out. Specifically, the temperature range where each adhesive tape could be adhered by means of a taping machine was determined.

It was found that the adhesive tapes of the present invention and the adhesive tape of Comparative Example 1 could be adhered at a temperature range of from 100 to 180, but that of Comparative Example 2 required a temperature of not less than 400° C.

(b) Oxidization of Leadframe

The evaluation of whether or not the oxidization took place during curing the adhesive was visually determined by observing the color change on the surface of the leadframe.

As a result, since the adhesive tapes of the present invention could be taped at a low temperature, no oxidation occurred, but in the case of Comparative Example 2 requiring a high adhesion temperature, the color change was observed, indicating that the leadframe was oxidized.

(c) Adhesion Strength

A 90° peel strength of 10 mm wide tape at room temperature was measured after the adhesive tape was adhered (taped) onto a copper plate at 140° C.

As a result, the adhesive tapes of the present invention was found to have a strength ranging from 25–40 g/10 mm, while the adhesive tape of Comparative Example 1 had a strength of 2–4 g/10 mm, and that of Comparative Example 2 had a strength of 10–40 g/10 mm, the last value having a large variation.

(d) Void

Whether or not the voids formed when the adhesive was cured was within the level problematic for a practical use was visually evaluated by means of a microscope.

As a result, in the case of the adhesives of the present-invention, no void could be found, whereas in the case of the adhesive of Comparative Example 1, the formation of voids was found.

(e) Processability

Handlings (curl, feedability, etc.) when the adhesive tapes were used in order to assemble leadframes, and the surface tackiness of the adhesive tapes were evaluated.

As a result, the adhesive tapes of the present invention was found to have good handling abilities, and that no tacking occurred on the surfaces, but the adhesive of Comparative Example 2 was found to be problematic in handling abilities.

(f) Wire Bondability

In the assembling of the package, the wire bondability onto the leadframe when wire bonding with the gold wire was determined.

As a result, in the case of using the adhesive tapes of the present invention, no bonding defect was observed in the tests for 832 pins. On the other hand, in the case of Comparative Example 1, bonding defects were observed in 125 of the 832 pins, indicating that the gold wire bonding could not be done with sufficient strength.

(g) Electrical Reliability Test of Semiconductor Packages

The packages obtained as described above were tested using the PCBT Test (Pressure Cooker Biased Test). The test was carried out at 5 V of applied voltage at 121° C., at 2 atmospheres, and at 100% relative humidity. As a result, in the case of the present invention, no shorting took place even after 1,000 hours.

As is clear from the results described above, in the case of-the adhesive tape obtained by using the liquid adhesive of the present invention, a semiconductor package can be produced in a good manner. In contrast, the adhesive tapes of Comparative Examples are not suitable for manufacturing electronic parts, because there are problems in that oxidation of leadframe occurs, the conditions for adhering are not suitable for assembling a leadframe, and the wire bonding of gold wire cannot be carried out.

What is claimed is:

1. An adhesive for electronic parts obtained by laminating one surface of a release film with an adhesive comprising:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the following formula (I):

$$\text{-}(CH_2-CH=CH-CH_2)_k\text{-}(CH_2-CH)_m\text{-}(CH_2-CH)_n\text{-} \quad (1)$$

with side groups CN and O=C—N(CH$_2$)$_2$N-piperazine-NH wherein, k, m and n are molar rations and taking n as 1, k is a number of 3–175, and m is a number of 0.3 to 93; and (b) a compound having at least two maleimides groups selected from the compounds represented by the following formulae (II-1) to (II-6):

(II-1): bis-maleimide with structure N-phenyl-O-phenyl-C(CH$_3$)$_2$-phenyl-O-phenyl-N (II-2): bis-maleimide N-phenyl-CH$_2$-phenyl-N (II-3): bis-maleimide N-(methylphenyl)-CH$_2$-(methylphenyl)-N -continued

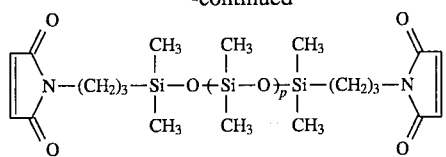
(II-4)

wherein p is an integer of from 0 to 7

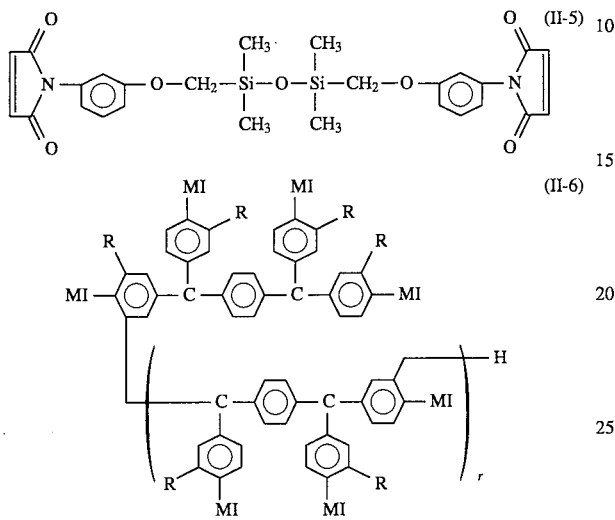

wherein MI=

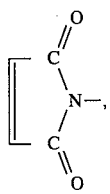

R=H or CH$_3$, and r=1–5 the ratio of component (b) based on 100 parts by weight of component (a) being in the range of 10 to 900 parts by weight.

2. The adhesive for electronic parts as claimed in claim 1, characterized by laminating one surface of a release film with an adhesive comprising:

(a) a piperazinylethylaminocarbonyl-containing butadiene-acrylonitrile copolymer having a weight average molecular weight of 10,000–200,000, an acrylonitrile content of 5–50% by weight, and an amino equivalent of 500–10,000, represented by the above formula (I), (b) a compound having at least two maleimide groups selected from the compounds represented by the above formulae (II-1) to (XI-6), and (c) a diamine compound represented by formula (III):

$$H_2N-R^1-NH_2 \quad (III)$$

wherein $R^1$ is a divalent aliphatic, aromatic, or alicyclic groups, or an amino-containing polysiloxane compound having a weight average molecular weight of 200–7,000 represented by the general formula (IV):

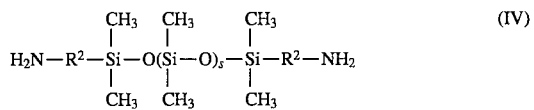

wherein $R^2$ is a divalent aliphatic, aromatic, or alicyclic group, and s is an integer of from 0 to 7, the sum of components (b) and (c) based on 100 parts by weight of component (a) being 10 to 900 parts by weight, and the molar equivalent of the maleimide group in component (b) per mol equivalent of the amino group in component (c) being 1 to 100 mol equivalent.

3. The adhesive for electronic parts as claimed in claim 1, wherein 4 to 40% by weight of a filler having a particle size of not more than 1 μm is contained in the adhesive layer.

* * * * *